(12) United States Patent
Teng et al.

(10) Patent No.: US 8,050,897 B2
(45) Date of Patent: Nov. 1, 2011

(54) SOLID FINITE ELEMENTS SUITABLE FOR SIMULATING LARGE DEFORMATIONS AND/OR ROTATIONS OF A STRUCTURE

(75) Inventors: Hailong Teng, Livermore, CA (US);
John O. Hallquist, Livermore, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 468 days.

(21) Appl. No.: 12/331,424

(22) Filed: Dec. 9, 2008

(65) Prior Publication Data
US 2010/0145662 A1   Jun. 10, 2010

(51) Int. Cl.
*G06F 17/10* (2006.01)
(52) U.S. Cl. .......................................................... 703/2
(58) Field of Classification Search .................... 703/1, 2
See application file for complete search history.

(56) References Cited

FOREIGN PATENT DOCUMENTS
JP         2005234787 A  *  9/2005

OTHER PUBLICATIONS

Shah M. Yunus et. al., "Solid Elements With Rotational Degrees of Freedom", 1991, International Journal for numerical methods in engineering vol. 31, pp. 573-610.*
Wan Cheng, "A Modified Shell Element Method for Determining 3D Large Strain Distributions in Sheet Metal Stamping", 1998, Communication in Numerical Method in Engineering, vol. 14, p. 519-527.*
Daniel C. Ross et. al., Hybrid Finite Element-Modal Analysis of Jet Engine inlet Scattering, 1995, IEEE Transactions and Antennas and Propagation, vol. 43, No. 3, pp. 277-285.*
Teng; Solid Elements with Rotational Degree of Freedom for Grand Rotation Problems in LS-DYNA; 11th International LS-DYNA Conference; pp. 3-57 to 3-63; 2010.*

* cited by examiner

*Primary Examiner* — Hugh Jones
(74) *Attorney, Agent, or Firm* — Roger H. Chu

(57) ABSTRACT

System and method of simulating large deformation and rotation of a structure in a finite element analysis used for improving structural design is disclosed. A solid finite element is configured for simulating large deformations and/or rotations of a structure. The solid finite element comprises only corner nodes with each node having six degrees-of-freedom (DOF), three translational and three rotational. In other words, each node is configured to include translational deformation and rotation deformation, each of the translational and rotational deformation has three components corresponding to one of the six DOFs. The solid finite element has a plurality of external edges. Each external edge has two ends, each end is located at one of the adjacent corner nodes. Additionally, translational deformation at mid-edge point of each external edge is implicitly embedded in the translational and rotational deformations of two adjacent corner nodes.

17 Claims, 9 Drawing Sheets

$$u_k = \frac{1}{2}(u_i + u_j) + \frac{y_j - y_i}{8}(\tan\theta_{zj} - \tan\theta_{zi})$$
$$+ \frac{z_j - z_i}{8}(\tan\theta_{yi} - \tan\theta_{yj})$$
$$- \left(y_k - \frac{y_i + y_j}{2}\right)\theta_{zo} + \left(z_k - \frac{z_i + z_j}{2}\right)\theta_{yo}$$

— 500A $$v_k = \frac{1}{2}(v_i + v_j) + \frac{z_j - z_i}{8}(\tan\theta_{xj} - \tan\theta_{xi})$$
$$+ \frac{x_j - x_i}{8}(\tan\theta_{zi} - \tan\theta_{zj})$$
$$- \left(z_k - \frac{z_i + z_j}{2}\right)\theta_{xo} + \left(x_k - \frac{x_i + x_j}{2}\right)\theta_{zo}$$

— 500B $$w_k = \frac{1}{2}(w_i + w_j) + \frac{x_j - x_i}{8}(\tan\theta_{yj} - \tan\theta_{yi})$$
$$+ \frac{y_j - y_i}{8}(\tan\theta_{xi} - \tan\theta_{xj})$$
$$- \left(x_k - \frac{x_i + x_j}{2}\right)\theta_{yo} + \left(y_k - \frac{y_i + y_j}{2}\right)\theta_{xo}$$

— 500C $$u_k = \frac{1}{2}(u_i + u_j) + \frac{y_j - y_i}{8}(\tan\theta_{zj} - \tan\theta_{zi})$$
$$+ \frac{z_j - z_i}{8}(\tan\theta_{yi} - \tan\theta_{yj})$$
$$- \left(y_k - \frac{y_i + y_j}{2}\right)\theta_{zo} + \left(z_k - \frac{z_i + z_j}{2}\right)\theta_{yo}$$

— 500A $$v_k = \frac{1}{2}(v_i + v_j) + \frac{z_j - z_i}{8}(\tan\theta_{xj} - \tan\theta_{xi})$$
$$+ \frac{x_j - x_i}{8}(\tan\theta_{zi} - \tan\theta_{zj})$$
$$- \left(z_k - \frac{z_i + z_j}{2}\right)\theta_{xo} + \left(x_k - \frac{x_i + x_j}{2}\right)\theta_{zo}$$

— 500B $$w_k = \frac{1}{2}(w_i + w_j) + \frac{x_j - x_i}{8}(\tan\theta_{yj} - \tan\theta_{yi})$$
$$+ \frac{y_j - y_i}{8}(\tan\theta_{xi} - \tan\theta_{xj})$$
$$- \left(x_k - \frac{x_i + x_j}{2}\right)\theta_{yo} + \left(y_k - \frac{y_i + y_j}{2}\right)\theta_{xo}$$

SOLID FINITE ELEMENTS SUITABLE FOR SIMULATING LARGE DEFORMATIONS AND/OR ROTATIONS OF A STRUCTURE

FIELD OF THE INVENTION

The present invention relates to computer aided engineering analysis used for assisting engineers and scientists in making design decision of a structure (e.g., an automobile, an airplane, a consumer product, etc.), more particularly to systems and methods for providing improved special purpose solid finite elements suitable for simulating large deformations and/or rotations of a structure such as a turbofan of a turbojet engine.

BACKGROUND OF THE INVENTION

Finite element analysis (FEA) is a computer aided engineering tool that uses numerical methods to obtain approximate solutions to complex engineering systems. FEA is routinely used in many other engineering fields, especially structural designs. It is also widely used in simulating time-elapsed events, such as car crashing and metal forming. It is a very powerful tool and used extensively by engineers and scientists in evaluating new product designs and existing product refinements prior to actual manufacturing and construction. FEA is generally implemented as finite element analysis software or application module to be installed in a computer system.

To perform a FEA, a finite element analysis model is first created based on the geometry of the structure under analysis. In the model, the subject structure is reduced to a finite number of nodes, which are inter-connected to by elements or finite elements. Material properties are assigned to the elements. The number of the nodes and the type of elements can be chosen to fit the specific needs and interests for the system in a finite element analysis. Additionally, constraints are placed on the model to ensure proper boundary conditions.

There are many types of finite elements: (1) one-dimensional element (e.g., beam element, truss element), (2) two-dimensional element (e.g., shell element), and (3) three-dimensional element (e.g., tetrahedral element, hexahedral element). Each finite element is implemented using a shape function to represent or describe its domain. The shape function may be low order (linear) or higher order (curve-linear). Elements that use low order shape function may require only corner nodes or end nodes, for example, an 8-node brick element 110A shown in FIG. 1A and a 4-node tetrahedral element 110B shown in FIG. 1B.

In order to use higher order shape function, elements require additional nodes, for example, a 20-node hexahedral element 110C shown in FIG. 1C and a 10-node tetrahedral element 110D shown in FIG. 1D. As a result of the additional nodes, computation becomes more complex thereby requiring more computing resources. This is a problem in today's production engineering environment as many of the modern FEA model comprises more than one million elements. In order to keep a reasonable turnaround time (e.g., overnight) for each FEA, users generally would like to use low order elements to maintain a reasonable turnaround time but still want to have the quality of the FEA results to include effects from high order shape function. It is noted that each node of the above mentioned prior art solid elements (i.e., elements 110A-B) include only translational deformation at each node, which is represented by three components u, v and w (i.e., three translational degrees-of-freedom) shown in respective Cartesian coordinate systems 100A-D.

Another problem arises when the prior art solid elements are used in conjunction with shell elements in one FEA model. Each node of the shell element has six degrees-of-freedom (DOFs) (i.e., three translational and three rotational), while the prior art solid element has only three translational DOFs. The incompatibility at common nodes shared between solid and shell elements often created numerical problem that rendered the simulation results useless. Therefore, it would be desirable to have an improved solid finite element that can overcome the problems and deficiencies in prior art approaches described above.

BRIEF SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

Systems and methods of simulating large deformations and rotations of a structure using a finite element analysis used for improving structural design are disclosed. According to one aspect of the present invention, a special purpose solid finite element is configured for simulating large deformations and/or rotations of a structure. The special purpose solid finite element comprises only corner nodes with each node having six degrees-of-freedom (DOF), three translational and three rotational. In other words, each node is configured to include translational deformation and rotation deformation, each of the translational and rotational deformation has three components corresponding to one of the six DOFs.

According to another aspect of the invention, the special purpose solid element is configured with a plurality of corner nodes and a plurality of external edges. Each external edge has two ends with each end is located at one of the adjacent corner nodes. Additionally, translational deformation at mid-edge of each external edge is implicitly included in the translational and rotational deformations of two adjacent corner nodes.

According to yet another aspect, a finite element analysis (FEA) model is created for the structure to be designed and/or improved. The finite element analysis model includes at least one special purpose solid element suitable for simulating large deformation and rotation of the structure. The FEA model is then used for performing a finite element analysis in a computer having a finite element analysis application module installed thereon. The finite element analysis application module is configured to facilitate computation of large deformation and rotation of the structure using the at least one special purpose solid element.

According one embodiment, the present invention is a method of simulating large deformation and rotation of a structure in a finite element analysis used for assisting users to improve structural design comprises at least the followings: defining a finite element analysis model of the structure, the finite element model contains at least one special purpose solid element configured for simulating large deformation and rotation of the structure, wherein the special purpose solid element comprises a plurality of corner nodes and a plurality of external edges, each of the external edges is located between a pair of the corner nodes adjacent to each other, and each of the pair of the adjacent corner nodes includes a deformation having three translational and three rotational components, said respective deformation of the pair of the adjacent corner nodes is so configured that mid-edge translational deformation of said each of the external edges is implicitly derived therefrom; performing the finite element analysis using said finite element analysis model in a computer having a finite element analysis application module installed thereon, wherein the finite element analysis application module is configured to facilitate computation of the large deformation and rotation of the structure using the at least one special purpose solid element; and adjusting structural design such that an improvement is achieved in accordance with the finite element analysis's result, wherein the result is configured to be visualized on a display monitor coupled to the computer.

According to another embodiment, the special purpose solid element is an 8-node hexahedral element with each node having six DOFs (three translational and three rotational). According to yet another embodiment, the special purpose solid element is a 4-node tetrahedral element with each node having six DOFs.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description appended claims, and accompanying drawings as follows:

FIG. 5A is a diagram showing a set of equations used for deriving mid-edge translational deformation in the special purpose solid element, according to an embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 2-7. However, those skilled in the art will readily appreciate that the detailed description given herein with respect to these figures is for explanatory purposes as the invention extends beyond these limited embodiments.

Figure 1A:
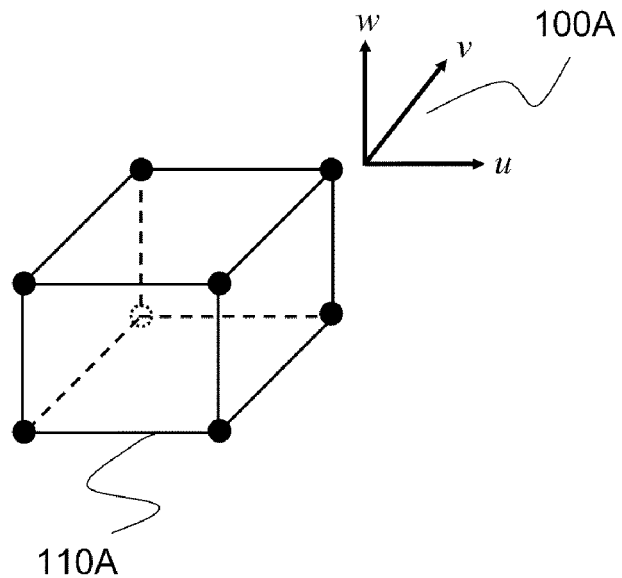
FIGS. 1A-1D are diagrams showing prior art solid elements.
Figure 1B:
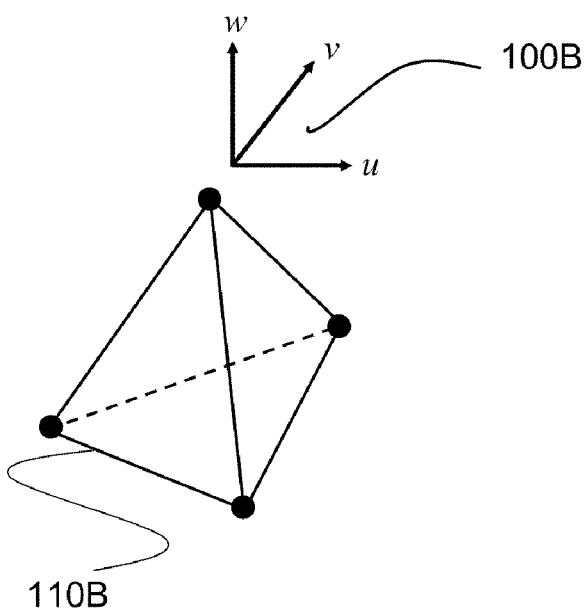
Figure 1C:
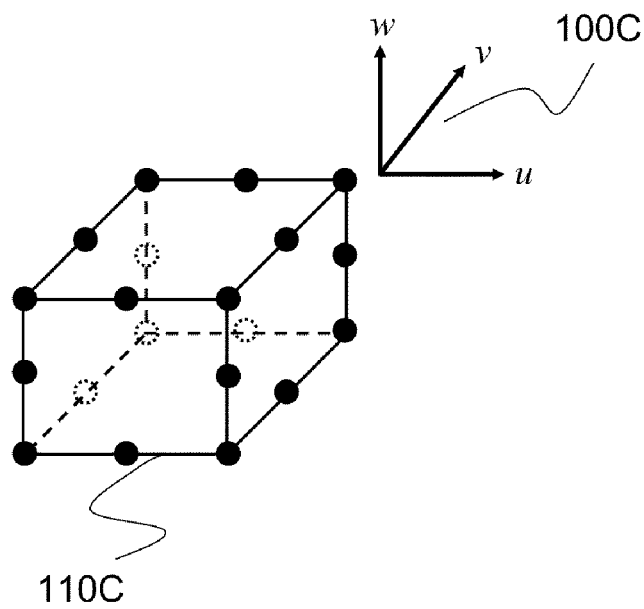
Figure 1D:
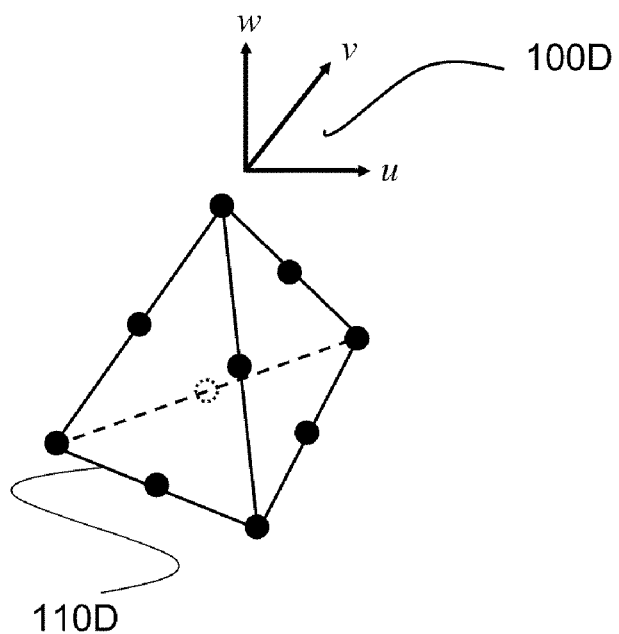
Figure 2:
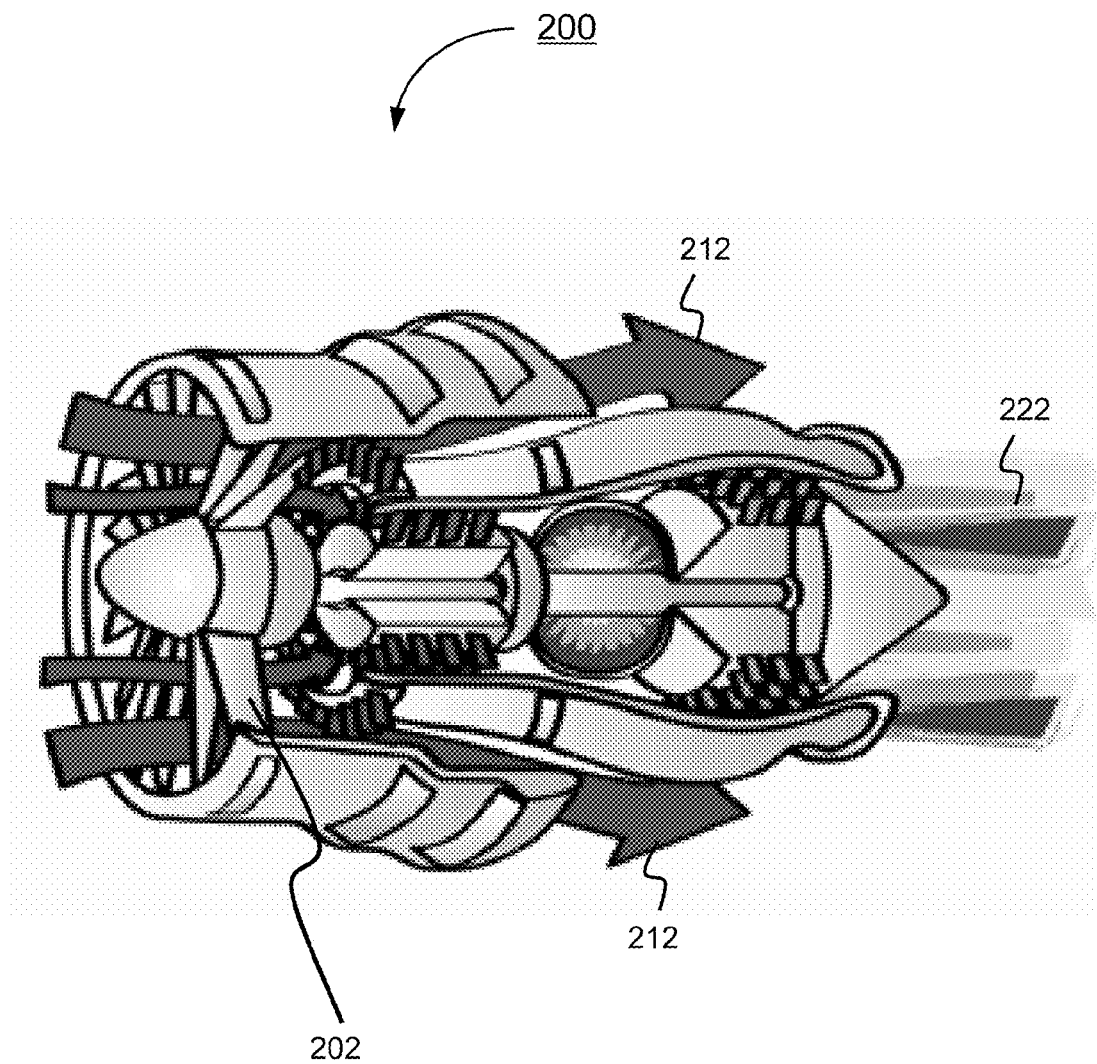
FIG. 2 is a diagram illustrating an exemplary turbojet engine that can be modeled using one or more special purpose solid elements in accordance with one embodiment of the present invention.
Figure 4A:
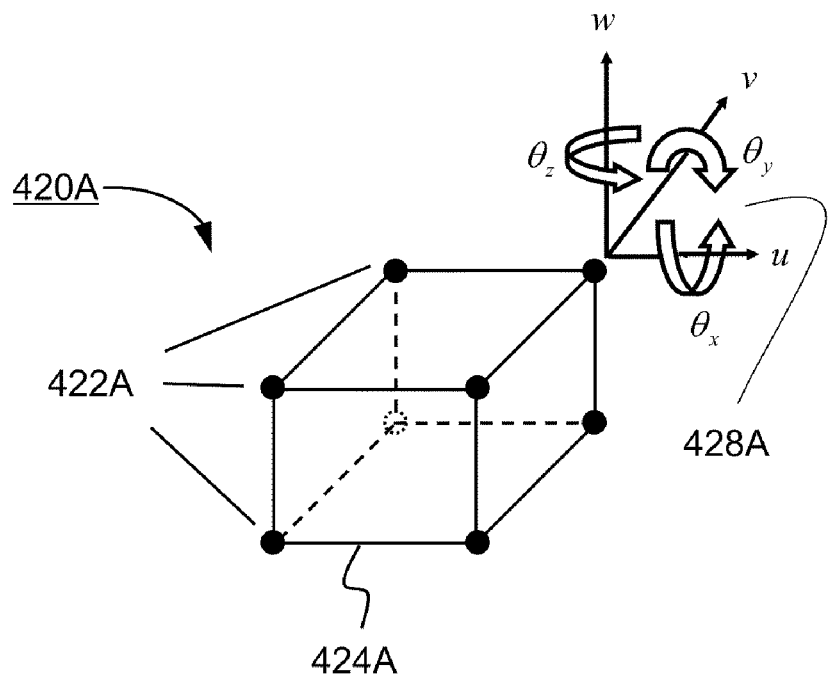
FIG. 4A is a diagram shows an exemplary special purpose solid element (i.e., an 8-node hexahedral element with six degrees-of-freedom at each node) in accordance with one embodiment of the present invention.
Figure 4B:
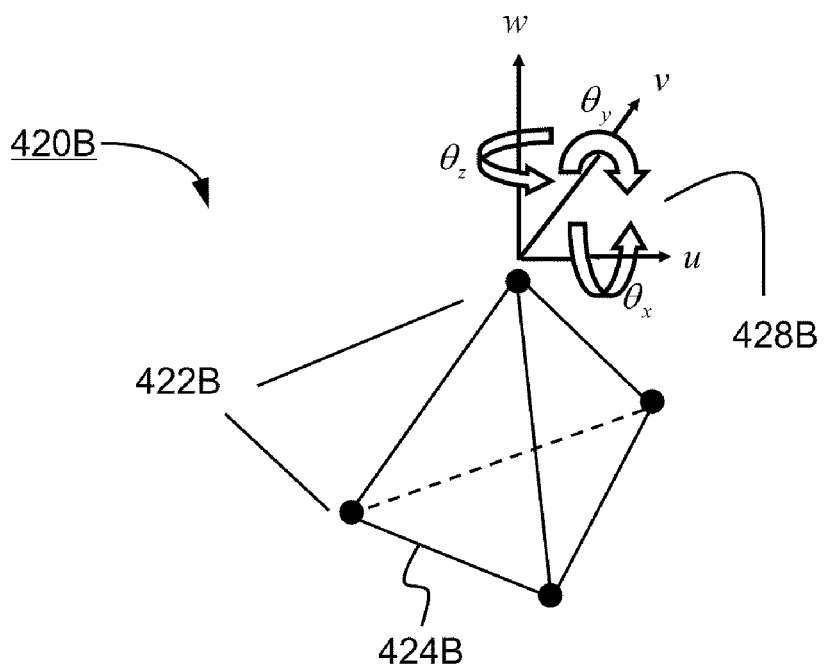
FIG. 4B is a diagram shows another exemplary special purpose solid element (i.e., a 4-node tetrahedral element with six degrees-of-freedom at each node) in accordance with one embodiment of the present invention.

Referring first to FIG. 2, it is shown an exemplary turbojet engine 200. One key component of the turbojet engine 200 is the turbofan 202, which rotates with high speed to suck in air 212 to generate thrust 222. In order to simulate the large deformation and rotation of the turbofan 202 accurately, moving portion of the structure (e.g., fan blades) needs to be modeled with special purpose solid elements suitable for simulating large rotation and deformation of a structure. In accordance with one embodiment of the present invention, two exemplary special purpose solid elements are shown in FIGS. 4A and 4B below.

Figure 3A:
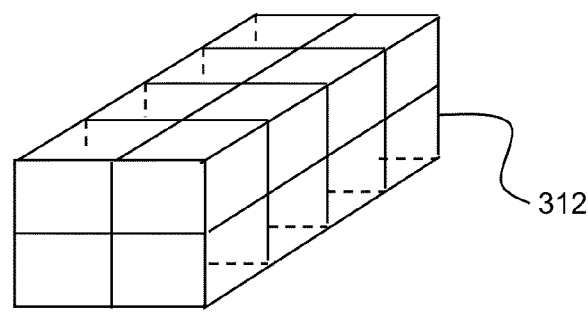
FIG. 3A is a diagram showing an exemplary structure (a prismatic beam) that is modeled using a plurality of hexahedral elements, each of which may be modeled with the special purpose solid element configured for simulating large deformation and/or rotation in accordance with one embodiment of the present invention.
Figure 3B:
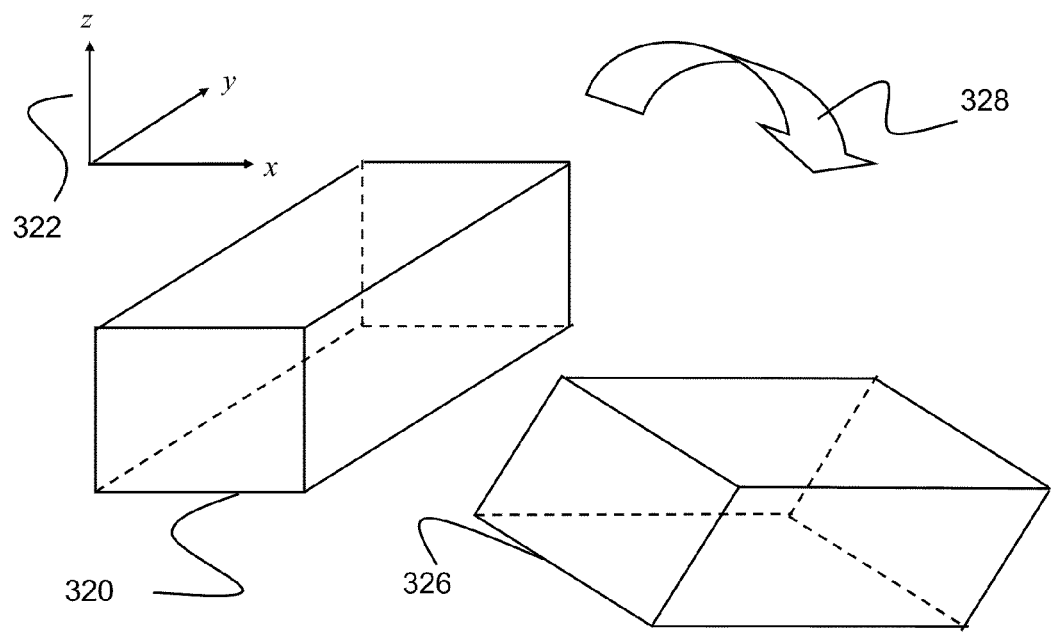
FIG. 3B is a diagram showing a large rotational movement of the exemplary prismatic beam of FIG. 3A.

FIG. 3A shows an exemplary finite element model 312 of a prismatic beam using a plurality of solid elements. When the prismatic beam is undergoing rotation (e.g., rigid-body rotation 328) as shown in FIG. 3B, the prismatic beam moves from the original orientation 320 to a new orientation 326. In general, a FEA model is defined in a global coordinate system 322, which is a Cartesian system with x-, y-, and z-axis Special purpose solid elements suitable for simulating large deformation and rotation of a structure may be used to model the structure (e.g., fan blades of a turbojet engine). In one embodiment, FIG. 4A shows an 8-node hexahedral element 420A. In another embodiment, FIG. 4B shows a 4-node tetrahedral element 420B. Either special purpose solid element contains a plurality of corner nodes 422A-B and a plurality of external edges 424A-B. Each of the external edges 424A-B is situated between two adjacent corner nodes 422A-B. Each corner node 422A-B is configured to have six degrees-of-freedom as shown in a coordinate system 428A-B. Six DOFs correspond to a nodal deformation with three translational components (u, v, w) and three rotational components ($\theta_x$, $\theta_y$, $\theta_z$).

In order for the special purpose solid element 420A-B to be suitable for simulating large deformation and rotation of a structure, the special purpose solid element is configured to include effects of high order shape function using a set of equations 500A-C shown in FIG. 5A. The special purpose solid element can derive mid-edge deformation of each external edge from deformation of two end nodes based on equations 500A-C. In other words, six components, three translational and three rotational components, of each pair of adjacent corner nodes implicitly include translational deformation at mid-edge of the external edge.

In the set of equations 500A-C, definitions of parameters and variables are listed as follows: $u_k$, $v_k$ and $w_k$ are three components of the mid-edge translation deformation of each external edge, respectively; $u_i$, $v_i$, $w_i$, $\theta_{xi}$, $\theta_{yi}$ and $\theta_{zi}$ are the three translation and three rotational components of the deformation of the first of the pair of nodes of the external edge, respectively; $u_j$, $v_j$, $w_j$, $\theta_{xj}$, $\theta_{yj}$ and $\theta_{zj}$ are the three translation and three rotational components of the deformation of the second of the pair of nodes of the external edge, respectively; $x_i$, $y_i$ and $z_i$ are coordinates of the first node, and $x_j$, $y_j$ and $z_j$ are coordinates of the second node in a global coordinate system, respectively; and $\theta_{xo}$, $\theta_{yo}$ and $\theta_{zo}$ are three respective components of the rigid-body rotation of said each of the at least one special purpose solid element.

Figure 5B:
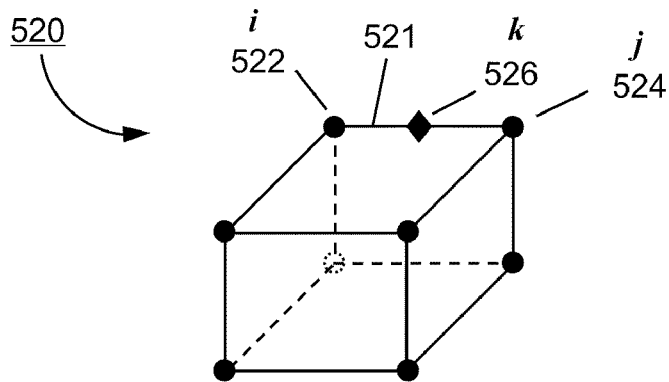
FIGS. 5B-5E graphically show terms used in the set of equations of FIG. 5A.

Diagrams shown in FIGS. 5B-5F are for better understanding of the above definitions. FIG. 5B shows an exemplary special purpose hexahedral element 520 that has eight corner nodes and eight external edges. For illustration simplicity, only one exemplary external edge 521 with a pair of adjacent corner nodes 522-524 are shown with labels. The external edge 521 is situated between a pair of adjacent corner nodes denoted as a first node i 522 and a second node j 524. The mid-edge point k 526 is located in middle of the external edge 521 equal distance to either of the pair of adjacent corner nodes 522-524. Subscripts, i, j, and k in equations 500A-C correspond to the first node 522, the second node 524 and the mid-edge point 526, respectively.

Figure 5C:
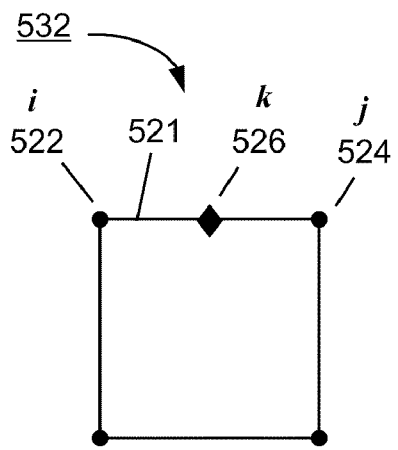
Figure 5D:
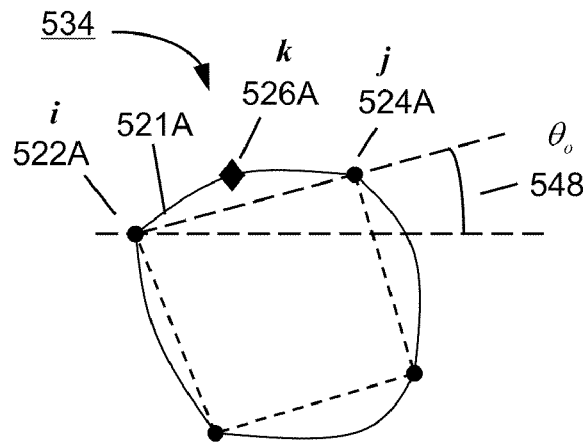

FIGS. 5C and 5D are two-dimensional (2-D) views of two states of the special purpose solid element. The first state 532 shows one face of the special purpose hexahedral element 520 in an undeformed or original state, while the second state 534 is a same view of a deformed state. It can be seen that the deformed edge 521A is not a straight line any more. Both the first and second nodes 522A-524A, and the mid-edge point 526A are located at different positions in the global coordinate system. The element 520 experiences a rigid-body rotation $\theta_o$ 548 from the undeformed state 532 to the deformed state 534.

Figure 5E:
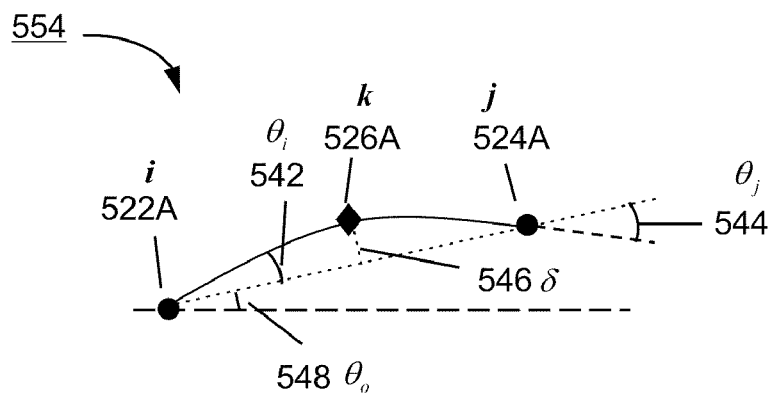

FIG. 5E is a diagram 554 showing further details of the external edge 521A in the deformed state 534. In particular, rotational deformations $\theta_i$ 542 and $\theta_j$ 544 at the first and second nodes 522A-524A are shown, respectively. The translational deformation $\delta$ 546 at the mid-edge point 526A is also shown in additional to the rigid-body rotation $\theta_o$ 548 of the element 520.

Figure 6:
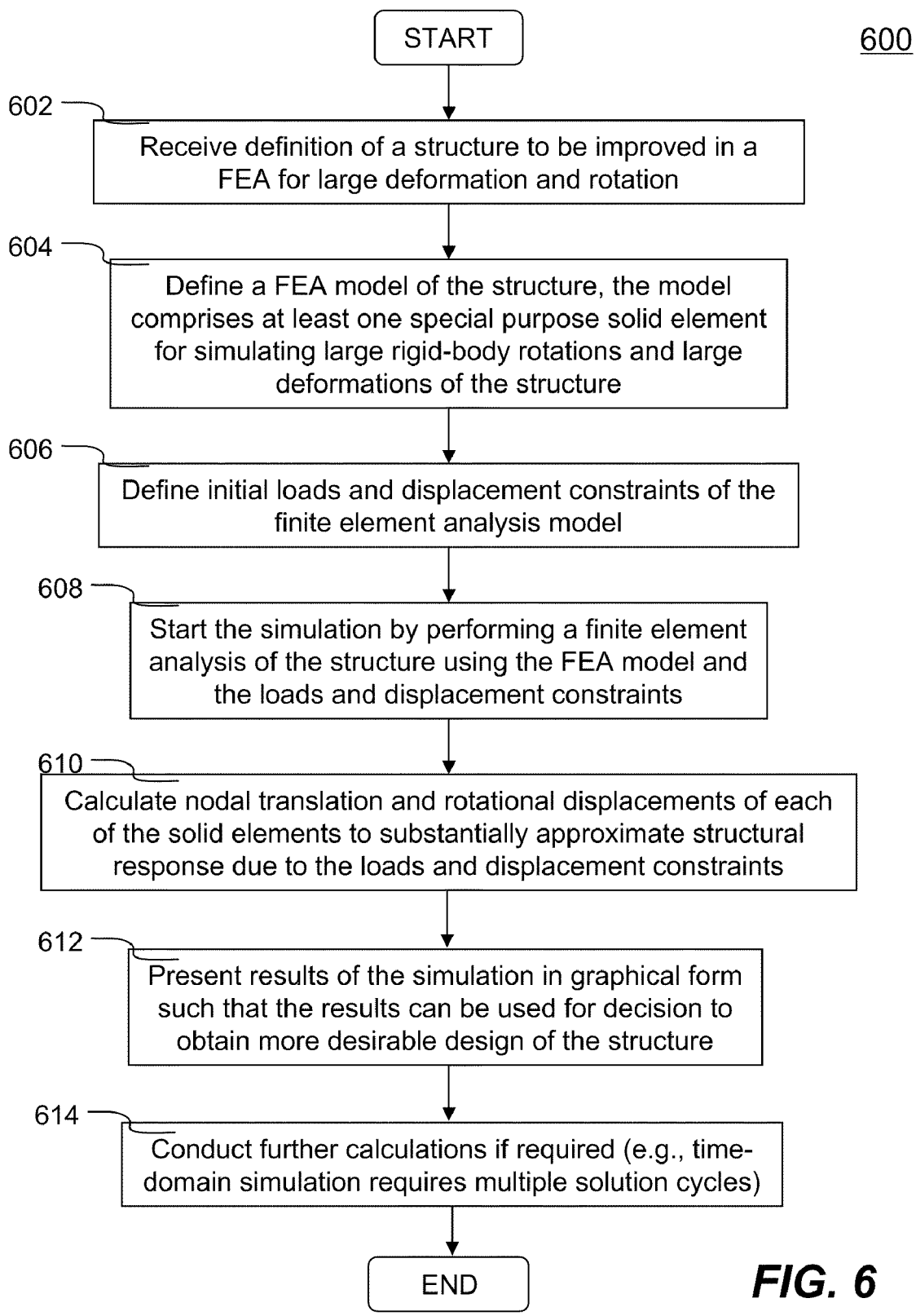
FIG. 6 is a flowchart illustrating an exemplary process of simulating large deformation and rotation of a structure in a finite element analysis used for improving structural design, according to an embodiment of the present invention.

Referring now to FIG. 6, a flowchart is shown to illustrate an exemplary process 600 of simulating large deformation and rotation of a structure in a finite element analysis used for assisting users to improve structural design in accordance with one embodiment of the present invention.

Process 600 starts by receiving a definition of a structure undergoing large deformations and/or rotations at step 602. The structure is to be improved under design by user or users (e.g., engineers and/or scientists). A finite element analysis model of the structure is then defined and created in step 604. The finite element analysis (FEA) model contains at least one special purpose solid element configured for simulating large deformation and rotation of the structure. The special purpose solid element has been shown and described in FIGS. 4A-4B and 5A-5E and corresponding descriptions thereof.

The large deformation and rotation includes rigid-body rotation of the structure. The large rotational movement is generally defined to be at least 10 degrees. After the FEA model has been defined and created, boundary and initial conditions such as loads and displacement constraints are specified to reflect the condition to be simulated at step 606. Next, at step 608, a finite element analysis is performed using the created FEA model in a computer having a corresponding finite element analysis application module installed thereon. The corresponding finite element analysis application module is configured to facilitate computation of large deformation and rotation of the structure.

At step 610, nodal displacements and element deformations are obtained from the finite element analysis including rotation and deformations of each of the special purpose solid elements. Each corner node of the special purpose solid element includes six deformation components, three in translation and three in rotation. The simulation results can then be present in graphical or text form via a graphical user interface displayed on a monitor coupled to the computer for the FEA at step 612. Finally, if the simulation is a time-marching or time-domain based simulation, further computations are conducted in multiple solution cycles at step 614 until the end of simulation has been reached.

Figure 7:
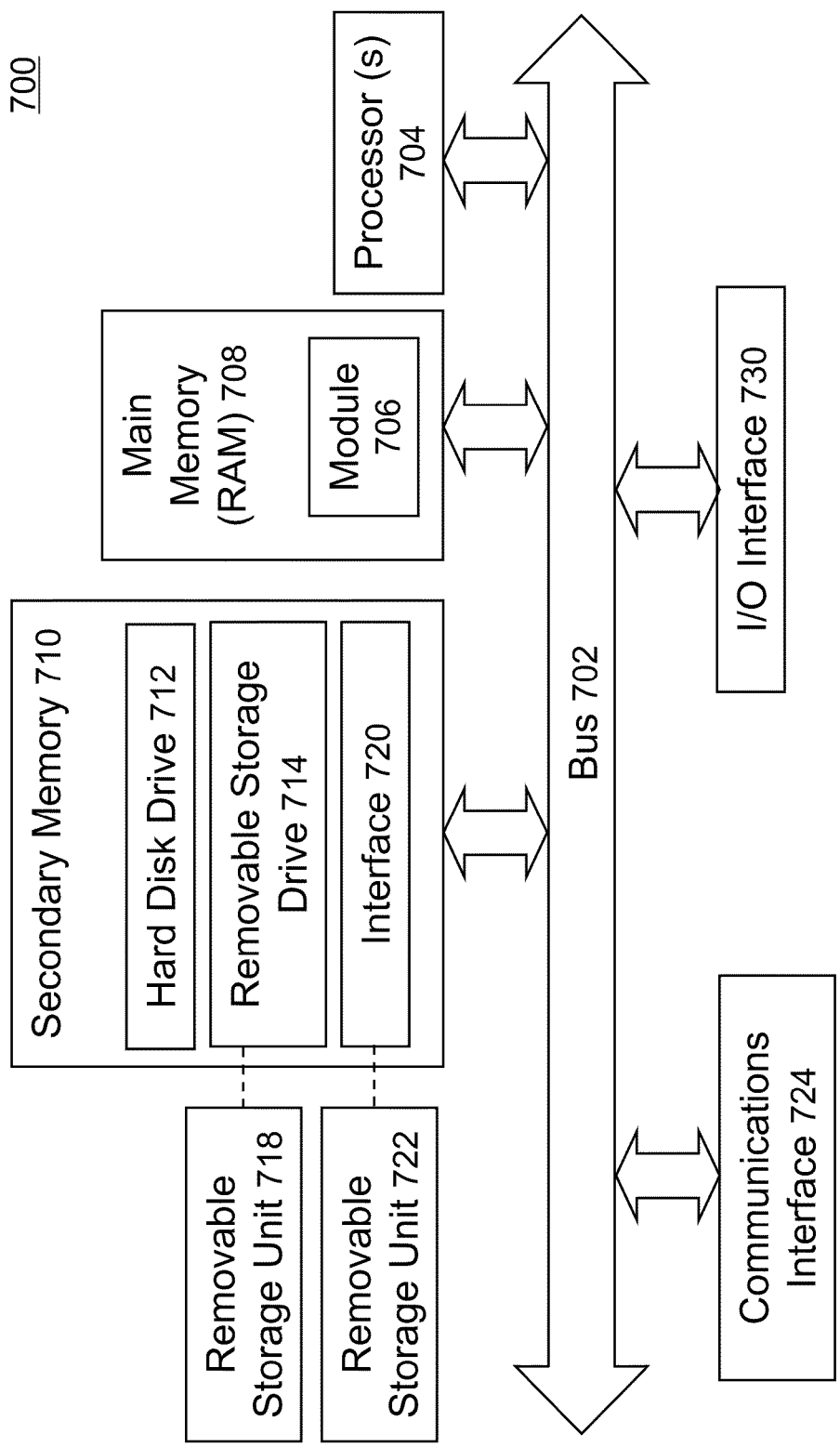
FIG. 7 is a function block diagram showing an exemplary computer, in which one embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium" and "computer usable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 (e.g., a FEA application module) that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). For example, the status of the FEA analysis (e.g., progress of a particular engineering simulation) is reported to the user via the I/O interface 730 either in a text or in a graphical representation on a display monitor coupled to the main memory 708 and the one or more processors 704.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas undeformed 532 and deformed states 534 are shown in FIGS. 5C-5D for terms used in the set of equations 500A-C, other comparisons may be used, for example, comparing two different deformed states. Furthermore, whereas hexahedral and tetrahedral elements are shown and described, other solid element such as pentahedral element may also be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of simulating large deformation and rotation of a structure in a finite element analysis used for assisting users to improve structural design comprising:

defining a finite element analysis model of the structure, the finite element model contains at least one solid finite element configured for simulating large deformation and rotation of the structure, wherein the solid finite element comprises a plurality of corner nodes and a plurality of external edges, each of the external edges is located between a pair of the corner nodes adjacent to each other, and each of the pair of the adjacent corner nodes includes a deformation having three translational and three rotational components, said respective deformation of the pair of the adjacent corner nodes is so configured that mid-edge translational deformation of said each of the external edges is implicitly derived therefrom;

wherein said three deformations at mid-edge of said each of the external edges is calculated as set forth in Equation as follows:

$$u_k = \frac{1}{2}(u_i + u_j) + \frac{y_j - y_i}{8}(\tan\theta_{zj} - \tan\theta_{zi}) + \frac{z_j - z_i}{8}(\tan\theta_{yi} - \tan\theta_{yj}) - \left(y_k - \frac{y_i + y_j}{2}\right)\theta_{zo} + \left(z_k - \frac{z_i + z_j}{2}\right)\theta_{yo}$$

$$v_k = \frac{1}{2}(v_i + v_j) + \frac{z_j - z_i}{8}(\tan\theta_{xj} - \tan\theta_{xi}) + \frac{x_j - x_i}{8}(\tan\theta_{zi} - \tan\theta_{zj}) - \left(z_k - \frac{z_i + z_j}{2}\right)\theta_{xo} + \left(x_k - \frac{x_i + x_j}{2}\right)\theta_{zo}$$

$$w_k = \frac{1}{2}(w_i + w_j) + \frac{x_j - x_i}{8}(\tan\theta_{yj} - \tan\theta_{yi}) + \frac{y_j - y_i}{8}(\tan\theta_{xi} - \tan\theta_{xj}) - \left(x_k - \frac{x_i + x_j}{2}\right)\theta_{yo} + \left(y_k - \frac{y_i + y_j}{2}\right)\theta_{xo}$$

where:

$u_k$, $v_k$ and $w_k$ are three components of the mid-edge translation deformation of said each of the external edge, respectively;

$u_i$, $v_i$, $w_i$, $\theta_{xi}$, $\theta_{yi}$ and $\theta_{zi}$ are the three translation and three rotational components of the deformation of a first node of the pair of nodes, respectively;

$u_j$, $v_j$, $w_j$, $\theta_{xj}$, $\theta_{yj}$ and $\theta_{zj}$ are the three translation and three rotational components of the deformation of a second node of the pair of nodes, respectively;

$x_i$, $y_i$ and $z_i$ are coordinates of the first node, and $x_j$, $y_j$ and $z_j$ are coordinates of the second node in a global coordinate system, respectively; and $\theta_{xo}$, $\theta_{yo}$ and $\theta_{zo}$ are three respective components of the rigid-body rotation of said each of the at least one solid finite element;

performing the finite element analysis using said finite element analysis model in a computer having a finite element analysis application module installed thereon, wherein the finite element analysis application module is configured to facilitate computation of the large deformation and rotation of the structure for the finite element model; and adjusting structural design such that an improvement is achieved in accordance with the finite element analysis's result, wherein the result is configured to be visualized on a display monitor coupled to the computer.

2. The method of claim 1, further comprises conducting a time-marching or time-domain simulation of the structure.

3. The method of claim 1, wherein said each of the at least one solid finite element further includes a rigid-body rotation.

4. The method of claim 1, wherein each of the at least one solid finite element is a hexahedral element.

5. The method of claim 1, wherein each of the at least one solid finite element is a tetrahedral element.

6. The method of claim 1, wherein the large deformation and rotation of the structure comprises movement of at least 10 degrees.

7. The method of claim 1, wherein said simulating the large deformation and rotation of the structure comprises a simulation of motions of fans blades in a turbojet engine.

8. A system for simulating large deformation and rotation of a structure in a finite element analysis used for assisting users to improve structural design comprising:
    a main memory having a finite element analysis application module installed thereon;
    at least one processor coupled to the main memory, said at least one processor executing the finite element application module in the main memory to cause the finite element application module to perform a finite element analysis using a finite element analysis model of the structure, wherein the finite element analysis model contains at least one solid finite element configured for simulating large deformation and rotation of the structure, wherein the solid finite element comprises a plurality of corner nodes and a plurality of external edges, each of the external edges is located between a pair of the corner nodes adjacent to each other, and each of the pair of the adjacent corner nodes includes a deformation having three translational and three rotational components, said respective deformation of the pair of the adjacent corner nodes is so configured that mid-edge translational deformation of said each of the external edges is implicitly derived therefrom, and
    wherein said three deformations at mid-edge of said each of the external edges is calculated as set forth in Equation as follows:

$$u_k = \frac{1}{2}(u_i + u_j) + \frac{y_j - y_i}{8}(\tan\theta_{zj} - \tan\theta_{zi}) + \frac{z_j - z_i}{8}(\tan\theta_{yi} - \tan\theta_{yj}) -$$

$$\left(y_k - \frac{y_i + y_j}{2}\right)\theta_{zo} + \left(z_k - \frac{z_i + z_j}{2}\right)\theta_{yo}$$

$$v_k = \frac{1}{2}(v_i + v_j) + \frac{z_j - z_i}{8}(\tan\theta_{xj} - \tan\theta_{xi}) +$$

$$\frac{x_j - x_i}{8}(\tan\theta_{zi} - \tan\theta_{zj}) -$$

$$\left(z_k - \frac{z_i + z_j}{2}\right)\theta_{xo} + \left(x_k - \frac{x_i + x_j}{2}\right)\theta_{zo}$$

$$w_k = \frac{1}{2}(w_i + w_j) + \frac{x_j - x_i}{8}(\tan\theta_{yj} - \tan\theta_{yi}) +$$

$$\frac{y_j - y_i}{8}(\tan\theta_{xi} - \tan\theta_{xj}) -$$

$$\left(x_k - \frac{x_i + x_j}{2}\right)\theta_{yo} + \left(y_k - \frac{y_i + y_j}{2}\right)\theta_{xo}$$

where:
    $u_k$, $v_k$ and $w_k$ are three components of the mid-edge translation deformation of said each of the external edge, respectively;
    $u_i$, $v_i$, $w_i$, $\theta_{xi}$, $\theta_{yi}$ and $\theta_{zi}$ are the three translation and three rotational components of the deformation of a first node of the pair of nodes, respectively;
    $u_j$, $v_j$, $w_j$, $\theta_{xj}$, $\theta_{yj}$ and $\theta_{zj}$ are the three translation and three rotational components of the deformation of a second node of the pair of nodes, respectively;
    $x_i$, $y_i$ and $z_i$ are coordinates of the first node, and $x_j$, $y_j$ and $z_j$ are coordinates of the second node in a global coordinate system, respectively; and
    $\theta_{xo}$, $\theta_{yo}$ and $\theta_{zo}$ are three respective components of the rigid-body rotation of said each of the at least one solid finite element.
    a display monitor coupled to the main memory and the at least one processor configured for displaying the finite element analysis's result.

9. The system of claim 8, wherein the finite element analysis is a time-marching or time-domain analysis.

10. The system of claim 8, wherein said simulating the large deformation and rotation of the structure comprises a simulation of motions of fan blades in a turbojet engine.

11. The system of claim 8, wherein said each of the at least one solid finite element further includes a rigid-body rotation.

12. The system of claim 8, wherein the solid finite element is a hexahedral element.

13. The system of claim 8, wherein the solid finite element is a tetrahedral element.

14. A computer-readable storage medium containing instructions for controlling a computer system to simulating large deformation and rotation of a structure in a finite element analysis used for assisting users to improve structural design by a method comprising:
    receiving a finite element analysis model of the structure that contains at least one solid finite element used for simulating large deformation and rotation of a structure, wherein the finite element analysis model contains at least one solid finite element configured for simulating large deformation and rotation of the structure, wherein the solid finite element comprises a plurality of corner nodes and a plurality of external edges, each of the external edges is located between a pair of the corner nodes adjacent to each other, and each of the pair of the adjacent corner nodes includes a deformation having three translational and three rotational components, said respective deformation of the pair of the adjacent corner nodes is so configured that mid-edge translational deformation of said each of the external edges is implicitly derived therefrom; and
    wherein said three deformations at mid-edge of said each of the external edges is calculated as set forth in Equation as follows:

$$u_k = \frac{1}{2}(u_i + u_j) + \frac{y_j - y_i}{8}(\tan\theta_{zj} - \tan\theta_{zi}) + \frac{z_j - z_i}{8}(\tan\theta_{yi} - \tan\theta_{yj}) -$$

$$\left(y_k - \frac{y_i + y_j}{2}\right)\theta_{zo} + \left(z_k - \frac{z_i + z_j}{2}\right)\theta_{yo}$$

$$v_k = \frac{1}{2}(v_i + v_j) + \frac{z_j - z_i}{8}(\tan\theta_{xj} - \tan\theta_{xi}) +$$

$$\frac{x_j - x_i}{8}(\tan\theta_{zi} - \tan\theta_{zj}) -$$

-continued
$$\left(z_k - \frac{z_i+z_j}{2}\right)\theta_{xo} + \left(x_k - \frac{x_i+x_j}{2}\right)\theta_{zo}$$

$$w_k = \frac{1}{2}(w_i + w_j) + \frac{x_j - x_i}{8}(\tan\theta_{yj} - \tan\theta_{yi}) +$$
$$\frac{y_j - y_i}{8}(\tan\theta_{xi} - \tan\theta_{xj}) -$$
$$\left(x_k - \frac{x_i+x_j}{2}\right)\theta_{yo} + \left(y_k - \frac{y_i+y_j}{2}\right)\theta_{xo}$$

where:

$u_k$, $v_k$ and $w_k$ are three components of the mid-edge translation deformation of said each of the external edge, respectively;

$u_i$, $v_i$, $w_i$, $\theta_{xi}$, $\theta_{yi}$ and $\theta_{zi}$ are the three translation and three rotational components of the deformation of a first node of the pair of nodes, respectively;

$u_j$, $v_j$, $w_j$, $\theta_{xj}$, $\theta_{yj}$ and $\theta_{zj}$ are the three translation and three rotational components of the deformation of a second node of the pair of nodes, respectively;

$x_i$, $y_i$ and $z_i$ are coordinates of the first node, and $x_j$, $y_j$ and $z_j$ are coordinates of the second node in a global coordinate system, respectively; and $\theta_{xo}$, $\theta_{yo}$ and $\theta_{zo}$ are three respective components of the rigid-body rotation of said each of the at least one solid finite element; and performing the finite element analysis that is configured to facilitate computation of the large deformation and rotation of the structure for the finite element model.

15. The computer-readable storage medium of claim 14, wherein the finite element analysis is a time-marching or time-domain analysis.

16. The computer-readable storage medium of claim 14, wherein said simulating the large deformation and rotation of the structure comprises a simulation of motions of fan blades in a turbojet engine.

17. The computer-readable storage medium of claim 14, wherein said each of the at least one solid finite element further includes a rigid-body rotation.

* * * * *